US007211900B2

(12) United States Patent
Shin et al.

(10) Patent No.: US 7,211,900 B2
(45) Date of Patent: May 1, 2007

(54) THIN SEMICONDUCTOR PACKAGE INCLUDING STACKED DIES

(75) Inventors: Won Sun Shin, Kyungki-do (KR); Do Sung Chun, Chacheongsao (TH); Seon Goo Lee, Kyonggi-do (KR); Il Kwon Shim, Singapore (SG); Vincent DiCaprio, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/129,596

(22) Filed: May 13, 2005

(65) Prior Publication Data

US 2005/0205979 A1 Sep. 22, 2005

Related U.S. Application Data

(60) Continuation of application No. 10/600,931, filed on Jun. 20, 2003, now Pat. No. 6,982,488, which is a division of application No. 09/648,284, filed on Aug. 24, 2000, now Pat. No. 6,798,049.

(30) Foreign Application Priority Data

| Aug. 24, 1999 | (KR) | ................................ 99-35108 |
| Dec. 30, 1999 | (KR) | ................................ 99-65926 |
| Dec. 30, 1999 | (KR) | ................................ 99-65934 |

(51) Int. Cl.
*H01L 23/48* (2006.01)
*H01L 23/52* (2006.01)
*H01L 29/40* (2006.01)
*H01L 23/34* (2006.01)

(52) U.S. Cl. .................. 257/777; 257/686; 257/784; 257/723; 257/E23.022

(58) Field of Classification Search ................ 257/777, 257/678, 698, 723, 784, 686
See application file for complete search history.

(56) References Cited

U.S. PATENT DOCUMENTS 3,851,221 A 11/1974 Beaulieu et al. ............ 317/100

(Continued)

FOREIGN PATENT DOCUMENTS

EP 0 503 201 A2 9/1992

(Continued)

OTHER PUBLICATIONS

Smith et al., U.S. Appl. No. 09/944,732, filed Aug. 31, 2001, entitled "*Thin Semiconductor Package Including Stacked Dies*".

*Primary Examiner*—Nitin Parekh
(74) *Attorney, Agent, or Firm*—Gunnison, McKay & Hodgson, L.L.P.; Serge J. Hodgson

(57) ABSTRACT

A semiconductor package and method for fabricating the same is disclosed. In one embodiment, the semiconductor package includes a circuit board, at least two semiconductor chips, electric connection means, an encapsulant, and a plurality of conductive balls. The circuit board has a resin layer and a circuit pattern. The resin layer is provided with an opening at its center portion. The circuit pattern is formed on at least one of upper and lower surfaces of the resin layer and includes one or more bond fingers and ball lands exposed to the outside. The semiconductor chips have a plurality of input/output pads on an active surface thereof. The semiconductor chips are stacked at a position of the opening of the circuit board, with at least one of the chips being within the opening. Alternatively, both chips are in the opening. The electric connection means connects the input/output pads of the semiconductor chips to the bond fingers of the circuit board. The encapsulant surrounds the semiconductor chips so as to protect the chips from the external environment. The conductive balls are fusion-bonded on the ball lands of the circuit board.

20 Claims, 15 Drawing Sheets

U.S. PATENT DOCUMENTS

| | | | |
|---|---|---|---|
| 4,567,643 A | 2/1986 | Droguet et al. | 29/575 |
| 4,729,061 A | 3/1988 | Brown | 361/386 |
| 4,730,232 A | 3/1988 | Lindberg | 361/381 |
| 4,763,188 A | 8/1988 | Johnson | 357/74 |
| 4,982,265 A | 1/1991 | Watanabe et al. | 357/75 |
| 4,996,587 A | 2/1991 | Hinrichsmeyer et al. | 357/74 |
| 5,012,323 A | 4/1991 | Farnworth | 357/75 |
| 5,025,306 A | 6/1991 | Johnson et al. | 357/75 |
| 5,040,052 A | 8/1991 | McDavid | 357/80 |
| 5,138,438 A | 8/1992 | Masayuki et al. | 357/75 |
| 5,140,404 A | 8/1992 | Fogal et al. | 357/70 |
| 5,165,067 A | 11/1992 | Wakefield et al. | 257/783 |
| 5,198,888 A | 3/1993 | Sugano et al. | 257/686 |
| 5,200,362 A | 4/1993 | Lin et al. | 437/207 |
| 5,229,647 A | 7/1993 | Gnadinger | 257/785 |
| 5,273,938 A | 12/1993 | Lin et al. | 437/207 |
| 5,291,061 A | 3/1994 | Ball | 257/686 |
| 5,323,060 A | 6/1994 | Fogal et al. | 257/777 |
| 5,334,875 A | 8/1994 | Sugano et al. | 257/686 |
| 5,347,429 A | 9/1994 | Kohno et al. | 361/813 |
| 5,422,435 A | 6/1995 | Takiar et al. | 174/52.4 |
| 5,426,563 A | 6/1995 | Moresco et al. | 361/689 |
| 5,432,729 A | 7/1995 | Carson et al. | 365/63 |
| 5,436,203 A | 7/1995 | Lin | 437/209 |
| 5,463,253 A | 10/1995 | Waki et al. | 257/724 |
| 5,473,196 A | 12/1995 | De Givry | 257/786 |
| 5,474,957 A | 12/1995 | Urushima | 437/209 |
| 5,474,958 A | 12/1995 | Djennas et al. | 437/211 |
| 5,491,612 A | 2/1996 | Nicewarner, Jr. | 361/760 |
| 5,495,394 A | 2/1996 | Kornfeld et al. | 361/764 |
| 5,495,398 A | 2/1996 | Takiar et al. | 361/790 |
| 5,502,289 A | 3/1996 | Takiar et al. | 174/266 |
| 5,514,907 A | 5/1996 | Moshayedi | 257/723 |
| 5,545,922 A | 8/1996 | Golwalkar et al. | 257/676 |
| 5,569,625 A | 10/1996 | Yoneda et al. | 437/217 |
| 5,581,498 A | 12/1996 | Ludwig et al. | 365/63 |
| 5,587,341 A | 12/1996 | Masayuki et al. | 437/206 |
| 5,604,376 A | 2/1997 | Hamburgen et al. | 257/676 |
| 5,614,766 A | 3/1997 | Takasu et al. | 257/777 |
| 5,620,928 A | 4/1997 | Lee et al. | 438/118 |
| 5,637,536 A | 6/1997 | Val | 438/686 |
| 5,637,912 A | 6/1997 | Cockerill et al. | 257/620 |
| 5,646,828 A | 7/1997 | Degani et al. | 361/715 |
| 5,668,405 A | 9/1997 | Yamashita | 257/668 |
| 5,682,062 A | 10/1997 | Gaul | 257/686 |
| 5,689,135 A | 11/1997 | Ball | 257/676 |
| 5,696,031 A | 12/1997 | Wark | 437/209 |
| 5,696,666 A | 12/1997 | Miles et al. | 361/764 |
| 5,715,147 A | 2/1998 | Nagano | 361/813 |
| 5,721,452 A | 2/1998 | Fogal et al. | 257/685 |
| 5,737,191 A | 4/1998 | Horiuchi et al. | 361/764 |
| 5,739,581 A | 4/1998 | Chillara et al. | 257/668 |
| 5,763,939 A | 6/1998 | Yamashita | 257/668 |
| 5,777,387 A | 7/1998 | Yamashita et al. | 257/737 |
| 5,783,870 A | 7/1998 | Mostafazadeh et al. | 257/791 |
| 5,793,108 A | 8/1998 | Nakanishi et al. | 257/723 |
| 5,796,586 A | 8/1998 | Lee et al. | 361/748 |
| 5,798,014 A | 8/1998 | Weber | 156/263 |
| 5,815,372 A | 9/1998 | Gallas | 361/760 |
| 5,819,398 A | 10/1998 | Wakefield | 29/830 |
| 5,835,355 A | 11/1998 | Dordi | 361/760 |
| 5,861,666 A | 1/1999 | Bellaar | 257/686 |
| 5,866,949 A | 2/1999 | Schueller | 257/778 |
| 5,872,025 A | 2/1999 | Cronin et al. | 438/109 |
| 5,885,849 A | 3/1999 | DiStefano et al. | 438/108 |
| 5,886,412 A | 3/1999 | Fogal et al. | 257/777 |
| 5,894,108 A | 4/1999 | Mostafazadeh et al. | 174/52.4 |
| 5,903,052 A | 5/1999 | Chen et al. | 257/706 |
| 5,917,242 A | 6/1999 | Ball | 257/737 |
| 5,952,611 A | 9/1999 | Eng et al. | 174/52.4 |
| 5,973,403 A | 10/1999 | Wark | 257/777 |
| 5,977,640 A | 11/1999 | Bertin et al. | 257/777 |
| 5,986,317 A | 11/1999 | Wiese | 257/433 |
| 6,001,671 A | 12/1999 | Fjelstad | 438/112 |
| 6,005,778 A | 12/1999 | Spielberger et al. | 361/770 |
| 6,013,948 A | 1/2000 | Akram et al. | 257/698 |
| RE36,613 E | 3/2000 | Ball | 257/777 |
| 6,034,427 A | 3/2000 | Lan et al. | 257/698 |
| 6,051,886 A | 4/2000 | Fogal et al. | 257/777 |
| 6,057,598 A | 5/2000 | Payne et al. | 257/723 |
| 6,060,778 A | 5/2000 | Jeong et al. | 257/710 |
| 6,072,243 A | 6/2000 | Nakanishi | 257/783 |
| 6,080,264 A | 6/2000 | Ball | 156/292 |
| 6,100,804 A | 8/2000 | Brady et al. | 340/572.7 |
| 6,107,689 A | 8/2000 | Kozono | 257/778 |
| 6,118,184 A | 9/2000 | Ishio et al. | 257/787 |
| 6,126,428 A | 10/2000 | Mitchell et al. | 425/110 |
| 6,127,833 A | 10/2000 | Wu et al. | 324/755 |
| 6,133,637 A | 10/2000 | Hikita et al. | 257/777 |
| 6,160,705 A | 12/2000 | Stearns et al. | 361/704 |
| 6,172,419 B1 | 1/2001 | Kinsman | 257/737 |
| 6,180,881 B1 | 1/2001 | Isaak | 174/52.4 |
| 6,184,463 B1 | 2/2001 | Panchou et al. | 174/52.4 |
| 6,198,171 B1 | 3/2001 | Huang et al. | 257/787 |
| 6,214,641 B1 | 4/2001 | Akram | 438/107 |
| 6,235,554 B1 | 5/2001 | Akram et al. | 438/109 |
| 6,329,709 B1 | 12/2001 | Moden et al. | 257/690 |
| 6,395,578 B1 | 5/2002 | Shin et al. | 438/106 |
| 6,399,418 B1 | 6/2002 | Glenn et al. | 438/106 |
| 6,452,278 B1 * | 9/2002 | DiCaprio et al. | 257/777 |
| 6,501,184 B1 | 12/2002 | Shin et al. | 257/778 |
| 6,515,356 B1 | 2/2003 | Shin et al. | 257/678 |
| 6,541,854 B2 | 4/2003 | Huang et al. | 257/707 |
| 6,576,998 B1 | 6/2003 | Hoffman | 257/724 |
| 6,982,488 B2 * | 1/2006 | Shin et al. | 257/777 |

FOREIGN PATENT DOCUMENTS

| | | |
|---|---|---|
| JP | 54128274 | 10/1979 |
| JP | 56062351 | 5/1981 |
| JP | 61082731 | 9/1985 |
| JP | 61059862 | 3/1986 |
| JP | 61117858 | 6/1986 |
| JP | 62119952 | 6/1987 |
| JP | 62126661 | 6/1987 |
| JP | 62142341 | 6/1987 |
| JP | 63128736 | 6/1988 |
| JP | 63211663 | 9/1988 |
| JP | 63244654 | 10/1988 |
| JP | 1028856 | 1/1989 |
| JP | 64001269 | 1/1989 |
| JP | 1071162 | 3/1989 |
| JP | 1099248 | 4/1989 |
| JP | 3169062 | 7/1991 |
| JP | 4028260 | 1/1992 |
| JP | 456262 | 2/1992 |
| JP | 4096358 | 3/1992 |
| JP | 4116859 | 4/1992 |
| JP | 4368154 | 12/1992 |
| JP | 4368167 | 12/1992 |
| JP | 5013665 | 1/1993 |
| JP | 575015 | 3/1993 |
| JP | 5109975 | 4/1993 |
| JP | 5136323 | 6/1993 |
| JP | 5283601 | 10/1993 |
| JP | 10256470 | 9/1998 |

| | | |  | | | |
|---|---|---|---|---|---|---|
| JP | 11204565 | 7/1999 | | KR | 10-1999-0037928 | 9/1999 |
| KR | 10-1999-0016319 | 5/1999 | | KR | 1999-0080278 | 11/1999 |
| KR | 10-1999-0020939 | 6/1999 | | KR | 10-1999-0065926 | 12/1999 |
| KR | 10-1999-0035108 | 8/1999 | | KR | 10-1999-0065934 | 12/1999 |
| KR | 1999-0065599 | 8/1999 | | | | |
| KR | 10-1999-0037925 | 9/1999 | | \* cited by examiner | | |

THIN SEMICONDUCTOR PACKAGE INCLUDING STACKED DIES

CLAIM OF PRIORITY

This application is a continuation of U.S. application Ser. No. 10/600,931, filed on Jun. 20, 2003, now U.S. Pat. No. 6,982,488 entitled "Semiconductor Package And Method Of Fabricating Same", which is a divisional of U.S. application Ser. No. 09/648,284, filed Aug. 24, 2000 entitled "Semiconductor Package And Method For Fabricating The Same", now U.S. Pat. No. 6,798,049, issued Sep. 28, 2004.

BACKGROUND OF THE INVENTION a. Field of the Invention

The present invention relates, in general, to a semiconductor package and method for fabricating the same and, more particularly, to a semiconductor package and method for fabricating the same that allows a plurality of semiconductor chips to be fixedly stacked in a single, thin package.

b. Description of the Prior Art

Currently, there is a tendency in which a plurality of semiconductor chips are packaged and mounted on the motherboard of an electronic device such as a PCS phone, a cellular phone or a notebook to perform various functions within a minimum time, and semiconductor packages in which semiconductor chips are packaged and the electronic devices on which the semiconductor packages are mounted are miniaturized. In the meantime, in order to allow a semiconductor package to be thinned, there has been fabricated a semiconductor package in which an opening is formed in a circuit board and a semiconductor is disposed in the opening.

With reference to FIG. 7, the construction of such a semiconductor package 100' is described as follows.

As depicted in the drawing, reference numeral 20' designates a circuit board 20' that has an opening 27'. A semiconductor 2' on the upper surface of which a plurality of input/output pads 4' are formed is disposed in the opening 27' of the circuit board 20'. The circuit board 20' comprises a base resin layer 21'. A circuit pattern including a plurality of bond fingers 22' and ball lands 23' are formed on the upper surface of the base resin layer 21'. The surface of the circuit pattern is coated with a cover coat 24' with the bond fingers 22' and the ball lands 23' being exposed upward out of the cover coat 24'. The input/output pad 4' of the semiconductor chip 2' is electrically connected to the bond fingers 22' of the circuit board 20' by means of connection means 30'. Additionally, an encapsulation 40' is formed around the semiconductor chip 2' and the connection means 30' so as to protect them from the external environment. A plurality of conductive balls 50' are respectively fusion-welded on the ball lands 23' to allow the package to be easily mounted on a motherboard.

However, in the conventional semiconductor package 100', since only a single semiconductor chip 2' is disposed in the opening 27', there is an inherent shortcoming in the high density, function and capacity of semiconductor package 100'.

Furthermore, in a case where the semiconductor chip 2' disposed in the opening of the circuit board 20' is a memory chip, such as a flash memory chip, SRAM chip or the like, since a plurality of semiconductor packages 100' must be mounted on a motherboard (not shown), there occurs a problem in which the mounting density is limited.

Recently, there is an increased desire for a semiconductor in which an ASIC (application specific integrated circuit) semiconductor chip and a memory semiconductor chip are packaged together. However, the desire is not satisfied by the conventional semiconductor package.

In order to overcome the problem, there has been developed a stack type semiconductor package in which a plurality of semiconductors respectively having various functions are packaged into a single semiconductor package by stacking the semiconductor chips together. The construction of the stack type semiconductor package is depicted in FIGS. 8A and 8B. FIG. 8A is a cross section of the package. FIG. 8B is a plan view showing the package in a state where the package is not coated with an encapsulation.

In the conventional stack type semiconductor package, a circuit board 10 on which bond fingers 12 are formed includes a resin layer 11, circuit patterns 19 are formed on the upper and lower surfaces of the resin layer 11, and a first semiconductor chip 1 is bonded on the center portion of the circuit board 10 with a bonding layer 7 interposed between the circuit board 10 and the first semiconductor chip 1. Reference numeral 14 designates conductive via holes for connecting the upper circuit pattern 19 to the lower circuit pattern. 19, and reference numeral 15 designates cover coats for protecting the circuit patterns 19 from the external environment.

In addition, a second semiconductor chip 2 is bonded on the upper surface of the first semiconductor chip 1 with a bonding layer 7 interposed between the first and second semiconductor chip 1 and 2. The input/output pads 4A of the first semiconductor chip 1 and the input/output pads 4A of the second semiconductor chip 2 are formed along rectangular directions to prevent them from being overlapped. That is, as illustrated in FIG. 8B, the input/output pads 4A of the first semiconductor chip 1 and the input/output pads 4A of the second semiconductor chip 2 are prevented from being overlapped, in such a way that the input/output pads 4A of the first semiconductor chip 1 are arranged along the front and rear edges of the first semiconductor chip 1 and the input/output pads 4A of the second semiconductor chip 2 are arranged along the side edges of the second semiconductor chip 2. The input/output pads 4A of the first semiconductor chip 1 and the second semiconductor chip 2 are respectively connected to the bond fingers 12 of the circuit board 10 by means of connection means 20, such as conductive wires. A plurality of conductive balls 40 are respectively fusion-welded on a plurality of ball lands 13, which are formed on the lower surface of the circuit board 10, to transmit signals to a mother board. In the meantime, the first semiconductor chip 1, the second semiconductor chip 2 and the connection means 20 are encapsulated with an encapsulation 30 to protect them from the external environment.

However, in the conventional stack type semiconductor package 101', the first semiconductor chip is bonded on the circuit board and the second semiconductor chip is bonded on the first semiconductor chip. Accordingly, the package is very thick which is contrary to recent trends.

Additionally, since the height difference between the input/output pads and the circuit board is excessively enlarged, the loop height of the connection means, such as conductive wires that connect the second semiconductor chip to the circuit pattern, tends to be enlarged. Accordingly, since the loop angle becomes an acute angle, the sweeping phenomenon of the conductive wires occurs easily by the filling pressure during a molding process, thereby causing the inferiority of the package.

As another example of the conventional semiconductor package, a composite stack type semiconductor package 102' is illustrated in FIG. 9.

As depicted in the drawing, the conventional composite stack type semiconductor package is fabricated by stacking a plurality of conventional Ball Grid Array (BGA) semiconductor packages.

In each of the BGA semiconductor packages, a semiconductor chip 1 is positioned in the opening of a circuit board 10 on the upper and lower surfaces of which ball lands 13 are formed, the input/output pads (not shown) of the semiconductor chip 1 are respectively connected to the bond fingers 12 of conductive material formed on the upper surface of the circuit board 10 by conductive wires 20, the ball lands 13 are electrically connected to the bond fingers 12 through conductive via holes 14, conductive balls 40 are fusion-welded on the ball lands 13, and an encapsulation 30 is formed on the upper surface of the circuit board 10 to protect the semiconductor chip 1 and the conductive wires 20 from the external environment. In this case, the bond fingers 12 formed on the upper surface of the circuit board 10 are exposed to the outside, and projected pads 8 are respectively formed on the bond fingers 12.

In this conventional BGA package, since the semiconductor chip is disposed in the opening in the central portion of the circuit board, the semiconductor package can be fabricated to be relatively thin. Additionally, a plurality of BGA packages are stacked in such a way that one BGA package is bonded on another BGA package with the solder balls on the lower surface of the upper BGA being fusion-welded on the projected pads on the upper surface of the lower BGA, thereby increasing the mounting density of the package.

However, in the conventional composite stack type semiconductor package 102', since projected pads are formed on the periphery of the circuit board of the BGA package 103' and solder balls are fusion-welded on the projected pads, the semiconductor package causes inconvenience in having an extra step to form the projected pads, and has a limitation on the reduction of the thickness of electronic devices owing to the thickness of the projected pads. Additionally, in each of BGA packages, since a single chip is mounted in each package, there occur limitations on the maximization of the memory capacity of each package and the increase of the mounting density of each package.

SUMMARY OF THE INVENTION

Accordingly, the present invention has been made keeping in mind the above problems occurring in the prior art, and a first object of the present invention is to provide a semiconductor package in which at least two semiconductor chips are mounted at the position of the opening of a circuit board, thereby allowing the semiconductor package to be thinned and achieving high mounting density, high function and high capacity.

A second object of the present invention is to provide a semiconductor package in which solder ball lands are formed on the upper and lower surfaces of its circuit board and a plurality of sub-semiconductor packages are stacked using the solder ball lands, thereby allowing the semiconductor package to be thinned still more and maximizing mounting density and memory capacity.

A third object of the present invention is to provide a method for fabricating a semiconductor package in accordance with the first object, which is capable of eliminating a wire sweeping phenomenon.

In one embodiment of the invention, there is provided a semiconductor package, comprising: a circuit board having, a resin layer provided with an opening at its center portion, and a circuit pattern formed on at least one of the upper and lower surfaces of the resin layer, the circuit pattern including one or more bond fingers and ball lands exposed to the outside; at least two semiconductor chips on one surface of each of which a plurality of input/output pads are formed, the semiconductor chips being stacked at a position of the opening of the circuit board; electric connection means respectively connecting the input/output pads of the semiconductor chips to the bond fingers of the circuit board; an encapsulation with which the semiconductor chips are encapsulated so as to protect them from the external environment; and a plurality of conductive balls fusion-bonded on the ball lands of the circuit board; wherein at least one of the semiconductor chips exists within the opening of the circuit board.

In accordance with another embodiment of the invention, there is provided a semiconductor package, comprising: a first semiconductor chip on one surface of which a plurality of input/output pads are formed; a second semiconductor chip bonded by means of a bonding agent on one surface of the first semiconductor on which the input/output pads are formed; a circuit board having, a resin layer provided with an opening at its center portion, the opening being of a size for accommodating the first and second semiconductor chips, two circuit patterns formed on at least one of the upper and lower surfaces of the resin layer, and at least one cover coat with which the circuit pattern is coated; electric connection means respectively connecting the input/output pads of the first and second semiconductor chips to the bond fingers of the circuit board; an encapsulation with which the first and second semiconductor chips are encapsulated so as to protect them from the external environment; and a plurality of conductive balls fusion-bonded on the ball lands of the circuit board.

In various embodiments, one or both of the first and second semiconductor chips are rectangular in plan view, and the input/output pads of the first semiconductor chip and the input/output pads of the second semiconductor chip are respectively arranged along different directions in their sectional view or plan view.

In one embodiment, the first semiconductor chip is exposed out of the encapsulation at a surface opposite to a surface on which the second semiconductor chip is bonded.

In one embodiment, the input/output pads of the first and second semiconductor chips are arranged in directions opposite to those in which the conductive balls are arranged. Alternatively, the input/output pads of the first and second semiconductor chips are arranged in same directions as those in which the conductive balls are arranged.

The circuit board in one embodiment is fabricated in such a way that circuit patterns are formed on the upper and lower surfaces of the resin layer and the circuit patterns are electrically connected to each other through conductive via holes.

In accordance with another embodiment of the present invention, there is provided a semiconductor package, comprising: a circuit board having, a resin layer provided with an opening at its center portion, and two circuit patterns formed on the upper and lower surfaces of the resin layer, the circuit patterns including a plurality of bond fingers and ball lands exposed to the outside, wherein the circuit patterns are connected to each other through one or more via holes; a first semiconductor chip on a lower surface of which a plurality of input/output pads are formed, the first semiconductor chip being disposed in the opening of the circuit board; a second semiconductor chip on the upper surface of which a plurality of input/output pads are formed, the second semiconductor chip being bonded on the upper surface of the first semiconductor chip; connection means connecting the input/output pads of the first and second semiconductor chips to the bond fingers formed on the upper and lower surfaces of the circuit board; a first encapsulation with which a predetermined area of the lower surface of the circuit board covering the first semiconductor chip and the opening is encapsulated; a second encapsulation with which a predetermined area of the upper surface of the circuit board covering the second semiconductor chip and the opening is encapsulated; and a plurality of conductive balls fusion-bonded on the ball lands of the circuit board.

The package may further include a third semiconductor, the third semiconductor being connected to the bond fingers of the circuit board with connection means.

The package may further include a fourth semiconductor chip bonded on the lower surface of the first semiconductor chip, and connection means connecting the fourth semiconductor chip to the bond fingers of the circuit board.

The first encapsulation may be formed of a liquid phase encapsulation material and the second encapsulation may be formed of an epoxy molding compound.

The package may further include a dam formed along the upper surface of the circuit board in the vicinity of the opening so as to prevent a bonding agent for bonding the second semiconductor chip on the first semiconductor chip from overflowing.

In accordance with an embodiment of the present invention for accomplishing the second object, there is provided a semiconductor package, comprising: a semiconductor chip within an opening of a circuit board on the upper and lower surfaces of which two circuit patterns are respectively formed, the lower surface of the semiconductor chip and the lower surface of the circuit board being on a same plane; electric connection means respectively connecting the input/output pads of the semiconductor chips to the circuit pattern formed on the upper surface of the circuit board; a plurality of conductive via holes electrically connecting the circuit patterns formed on the upper and lower surfaces of the circuit board to each other; a plurality of ball lands on which a plurality of conductive balls are fusion-bonded, the ball lands being formed on the circuit patterns formed on the upper and lower surfaces of the circuit board; and an encapsulation for protecting the semiconductor chip and the connection means from the external environment.

The semiconductor chip may consist of at least two stacked sub-semiconductor chips, input/output pads of the sub-semiconductor chips being electrically connected to the circuit pattern formed on the upper surface of the circuit board by the connection means.

The semiconductor package may further include one or more additional semiconductor packages wherein a plurality of solder balls are fusion-bonded on the ball lands formed on the lower surface of the circuit board of each semiconductor package, all the semiconductor packages being fixedly stacked together with the solder balls of the lower surface of the circuit board of one semiconductor package being fusion-bonded on the ball lands of the upper surface of the circuit board of another semiconductor package.

In accordance with an embodiment of the present invention, there is provided a method for fabricating a semiconductor package, comprising: providing a circuit board, the circuit board having a resin layer and two circuit patterns, the resin layer being provided with an opening at its center portion, the circuit patterns being formed on the upper and lower surfaces of the resin layer and including a plurality of bond fingers and ball lands exposed to the outside, wherein the circuit patterns are connected to each other through one or more via holes; disposing a first semiconductor chip, on the lower surface of which a plurality of input/output pads are formed, in the opening of the circuit board, and connecting the input/output pads of the first semiconductor chip to the bond fingers of the circuit board with connection means; primarily encapsulating a predetermined area of the lower surface of the circuit board covering the first semiconductor chip and the opening with an encapsulating material; bonding a second semiconductor chip, on the upper surface of which a plurality of input/output pads are formed, on the upper surface of the first semiconductor chip, and connecting the input/output pads of the second semiconductor chip to the bond fingers of the circuit board with connection means; secondly encapsulating a predetermined area of the upper surface of the circuit board covering the second semiconductor chip and the opening with an encapsulating material; and fusion-bonding a plurality of conductive balls on the ball lands of the circuit board.

The first semiconductor chip may consist of at least two sub-semiconductors, i.e., two chips stacked upon each other.

The second semiconductor chip also may consist of at least two sub-semiconductors.

The method may further include the step of bonding another semiconductor chip on the lower surface of the first semiconductor chip after the step of disposing the first semiconductor within the opening of the circuit board.

The method may further include the step of bonding another semiconductor chip on the upper surface of the second semiconductor chip after the step of bonding the second semiconductor.

In accordance with another embodiment of the present invention, there is provided a method for fabricating a semiconductor package, comprising: providing a circuit board, the circuit board having a resin layer and two circuit patterns, the resin layer being provided with an opening at its center portion, the circuit patterns being formed on the upper and lower surfaces of the resin layer and including a plurality of bond fingers and ball lands exposed to the outside, wherein the circuit patterns are connected to each other through one or more via holes; bonding at least one semiconductor chip over the opening of the circuit board, and connecting the input/output pads of the semiconductor chip to the bond fingers of the circuit board with connection means; primarily encapsulating the upper surface of the opening of the circuit board and the semiconductor chip with an encapsulating material; disposing at least one semiconductor chip, on the lower surface of which a plurality of input/output pads are formed, within the opening of the circuit board, and connecting the input/output pads of the semiconductor chip to the bond fingers of the circuit board with connection means; secondly encapsulating a predetermined area of the lower surface of the circuit board covering the semiconductor chip and the opening with an encapsulating material; and fusion-bonding a plurality of conductive balls on the ball lands of the circuit board.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EXEMPLARY EMBODIMENTS

This application claims priority to Korean patent applications 99-35108, 99-65926 and 99-65934, which were filed in the KIPO on Aug. 24, 1999, Dec. 30, 1999 and Dec. 30, 1999, respectively, and are incorporated herein by reference in their entireties. Certified copies have been filed herewith.

Figure 1A:
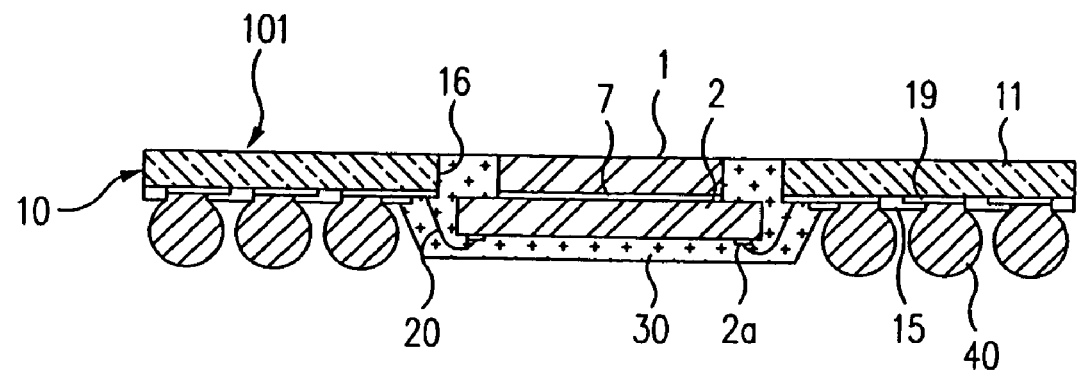
FIGS. 1A and 1B are cross sections showing semiconductor packages in accordance with a first embodiment of the present invention.
Figure 1B:
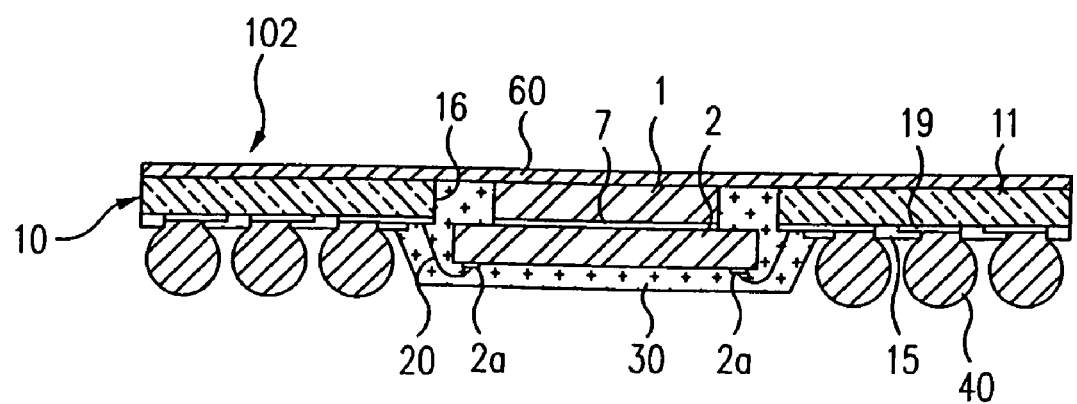

FIGS. 1A and 1B are cross sections showing semiconductor packages 101 and 102 in accordance with a first embodiment of the present invention. In the drawings, reference numeral 1 designates a first semiconductor chip 1 on the lower surface of which input/output pads (not shown) are formed. A second semiconductor 2 is bonded on the surface on which the input/output pads are formed with a bonding layer 7 interposed between the first and second semiconductor chips 1 and 2. The bonding layer 7 may be formed of an epoxy bonding agent or double-sided tape. Input/output pads 2a are formed on the lower surface of the second semiconductor 2, also.

At least one of the first and second semiconductor chips 1 and 2 is shaped in the form of an oblong rectangle in this example (though both may be oblong), so that the input/output pads of the first semiconductor chip 1 and the input/output pads 2a of the second semiconductor chip 2 are prevented from disturbing each other, thereby allowing a connecting process to be easily performed by means of connection means 20, such as conductive wires, leads, or extensions of the bond fingers. Of course, both of the first and second semiconductor chips may be shaped in the form of oblong rectangles. Additionally, the input/output pads of the first semiconductor chip 1 and the input/output pads 2a of the second semiconductor chip are formed on different positions in their sectional view or plan view (although not visible in FIGS. 1A and 1B), so that the connecting process is easily performed by means of connection means 20. That is, if the input/output pads of the first semiconductor chip 1 are formed along the front and rear edges of the first semiconductor chip 1, the input/output pads 2a of the second semiconductor chip 2 are formed along the side edges of the second semiconductor chip 2.

A circuit board 10 is disposed around the first semiconductor chip 1. A predetermined-sized opening 16 is formed in the center portion of the circuit board 10, and the first semiconductor chip 1 is accommodated in the opening 16. In the circuit board 10, a conductive pattern 19 is minutely formed on the lower surface of a resin layer 11, and the circuit pattern 19 is coated with a cover coat 15 for protecting the circuit pattern 19 from the external environment.

The input/output pads of the first and second semiconductor chips 1 and 2 are respectively connected to the circuit pattern 19 formed on the lower surface of the resin layer 11 by means of electric connection means 20, such as conductive wires. As a result, electric signals can be transmitted via the connection means from the first and second semiconductor chips 1 and 2 to the circuit pattern 19 or from the circuit pattern 19 to the first and second semiconductor chips 1 and 2.

The first and second semiconductor chips 1 and 2 and the connection means 20 are encapsulated with an encapsulation material for protecting them from dust, moisture, mechanical impact and the like. The area that is encapsulated with the encapsulation material is referred to as an encapsulation 30. A plurality of conductive balls 40 are fusion-bonded on the circuit pattern 19 formed on the lower surface of the resin layer 11 to allow the package to be mounted on a motherboard. The conductive balls 40 are preferably solder balls.

In this case, since the direction along which the input/output pads of the first semiconductor chip 1 and the input/output pads 2a of the second semiconductor chip 2 are arranged is the same as that of the circuit pattern 19 or the conductive balls 40, an additional circuit pattern and an additional cover coat may be formed on the upper surface of the circuit board 10.

The upper surface of the first semiconductor chip 1, that is, the surface that is not in contact with the second semiconductor chip 2, is exposed out of the encapsulation 30 to dissipate heat out of the package. As illustrated in FIG. 1B, a heat-conductive layer 60 of copper, aluminum or the like may be formed on the upper surfaces of the first semiconductor chip 1 and the resin layer 11 to improve the performance of heat dissipation.

Figure 2A:
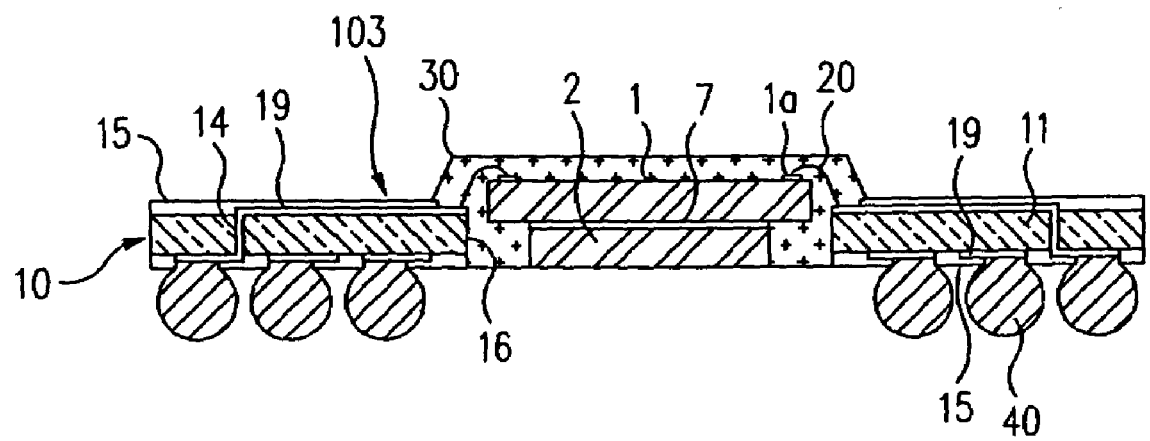
FIGS. 2A, 2B and 2C are cross sections showing semiconductor packages in accordance with a second embodiment of the present invention.

Although the input/output pads of the first and second semiconductor chips 1 and 2 are depicted to be formed on the lower surfaces of the first and second semiconductor chips 1 and 2 in FIGS. 1A and 1B, the input/output pads of the first and second semiconductor chips 1 and 2 may be formed on the upper surfaces of the first and second semiconductor chips 1 and 2 as depicted in FIG. 2A. In this case, a circuit pattern 19 is formed on the upper surface of the circuit board 10, that is, the upper surface of the resin layer 11, and the circuit pattern 19 is connected to the lower circuit pattern through conductive via holes 14 to secure signal passages. The upper circuit pattern 19 is coated with a cover coat 15 to protect the upper circuit pattern 19 from the external environment.

Figure 2B:
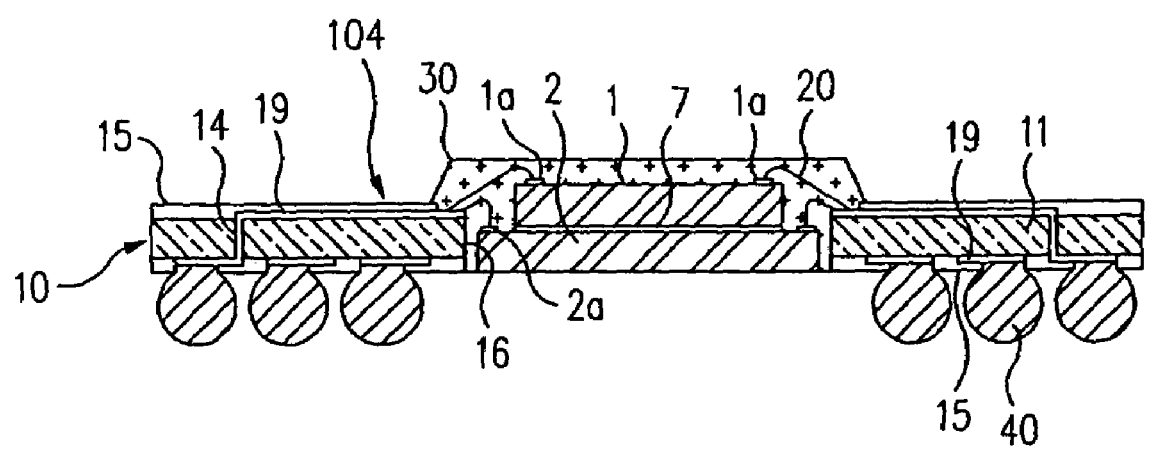
Figure 2C:
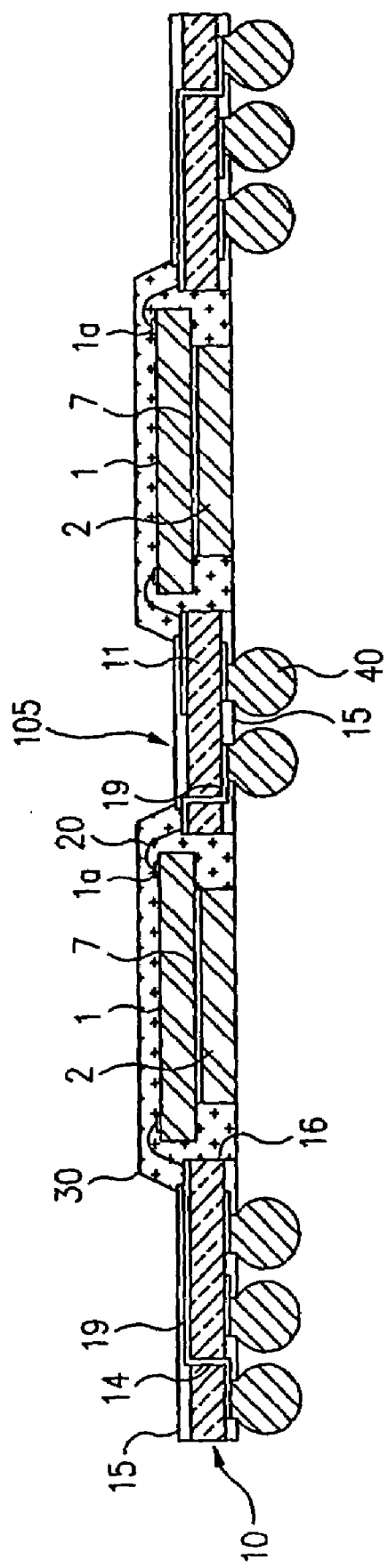

FIGS. 2A, 2B and 2C are cross sections showing semiconductor packages 103, 104 and 105 in accordance with a second embodiment of the present invention.

The semiconductor packages 103, 104 and 105 of the second embodiment are similar to the semiconductor packages 101 and 102 of the first embodiment. The difference between them is described as follows.

In the drawings, reference numeral 1 designates a first semiconductor chip 1 on the upper surface of which input/ output pads 1a are formed. A second semiconductor 2 is bonded on the surface of first semiconductor chip 1, on which input/output pads are not formed, by means of a bonding layer 7. Input/output pads 2a (not shown) are formed on the upper surface of the second semiconductor 2, also. The lower surface of the second semiconductor chip 2 is exposed out of an encapsulation 30 to improve the performance of heat dissipation.

A circuit board 10 is disposed around the first semiconductor chip 1. A predetermined-sized opening 16 is formed in the center portion of the circuit board 10, and the first semiconductor chip 1 is accommodated in the opening 16. In the circuit board 10, conductive patterns 19 are minutely formed on the upper and lower surfaces of a resin layer 11, and the circuit patterns 19 are coated with cover coats 15 for protecting the circuit patterns 19 from the external environment. The conductive patterns 19 formed on the upper and lower surfaces of a resin layer 11 are connected to each other through conductive via holes 14.

The input/output pads 1a of the first semiconductor chip 1 are connected to the circuit patterns 19 formed on the upper surface of the resin layer 11 by means of electric connection means 20, and the input/output pads 2a (not shown) of the second semiconductor chip 2 are connected to the circuit pattern 19 formed on the lower surface of the resin layer 11 by means of electric connection means 20, e.g., bond wires. As a result, electric signals are transmitted from the first and second semiconductor chips 1 and 2 to a mother board or from the mother board to the first and second semiconductor chips 1 and 2, through the connection means, the circuit patterns 19, the conductive via holes 14 and the circuit pattern 19.

In accordance with the second embodiment, a thin semiconductor package can be obtained because the first semiconductor chip 1 is disposed in the opening of the circuit board 10, and the sweeping phenomenon of the connection means 20 is prevented because the loop height of the connection means connecting the second semiconductor chip 2 to the circuit board 10 is relatively small. Low loop wire bonds may be used.

As illustrated in FIG. 2B, the sizes of the first and second semiconductor chips 1 and 2 may be different. That is, the size of the first semiconductor chip 1 is smaller than the size of the second semiconductor chip 2, and the second semiconductor chip 2 is bonded on the first semiconductor chip 1 using a bonding agent 7. In this case, there is an advantage in which the input/output pads of the first and second semiconductor chips are formed along a same direction. Of course, in this case, the semiconductor chip can be thinned by, for example, polishing or etching the backside of the wafer before dicing.

As depicted in FIG. 2C, a plurality of openings 16 are formed on the circuit board 10 and a plurality of semiconductor chips are stacked in each of openings 16. Accordingly, package 105 houses four semiconductor chips.

In the semiconductor packages in accordance with the first and second embodiments 101 to 105, since an opening is formed on the circuit board and reduces the thickness of the package, the semiconductor package can be thin notwithstanding that a plurality of semiconductor chips are stacked.

Additionally, since a plurality of semiconductor chips are stacked, various semiconductor chips having various functions can be provided in a single semiconductor package, for example, a memory chip and a logic chip or a processor chip can be stacked.

Furthermore, since the height difference between the input/output pads of the second semiconductor chip and the circuit board is equal to the height difference between the input/output pads of the first semiconductor chip and the circuit board, the hoop height of the connection means is relatively small. Accordingly, the possibility of the occurrence of the sweeping phenomenon of the connection means can be reduced notwithstanding that the semiconductor chips are stacked.

Figure 3A:
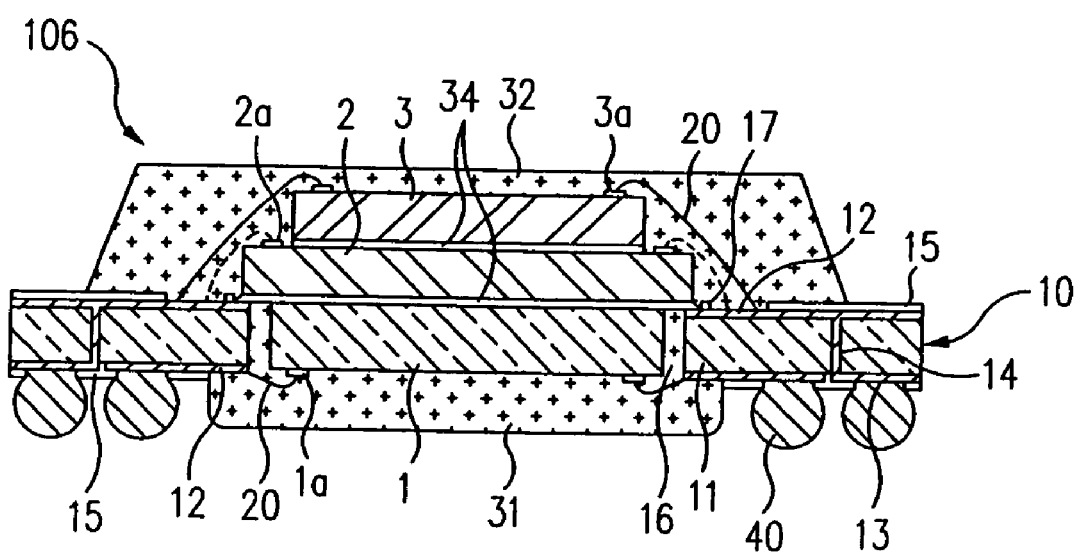
FIGS. 3A to 3C are cross sections showing semiconductor packages in accordance with a third embodiment of the present invention.
Figure 3B:
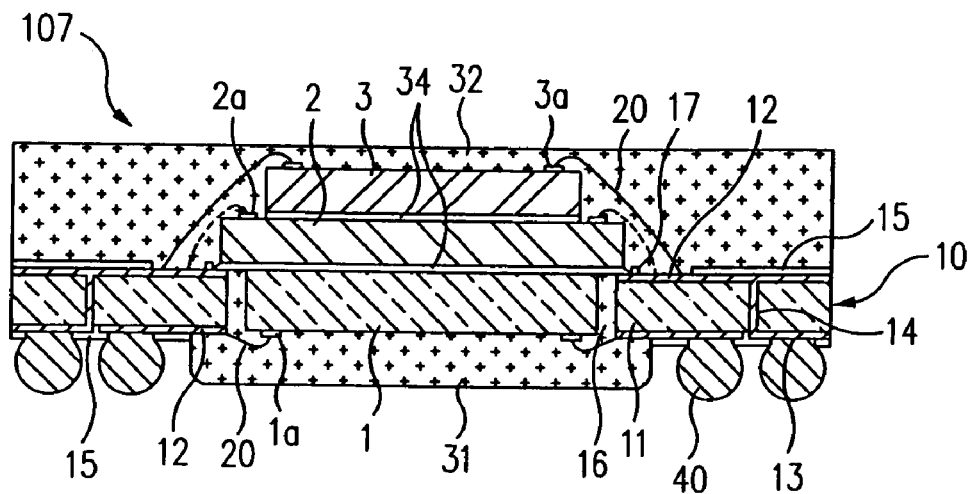
Figure 3C:
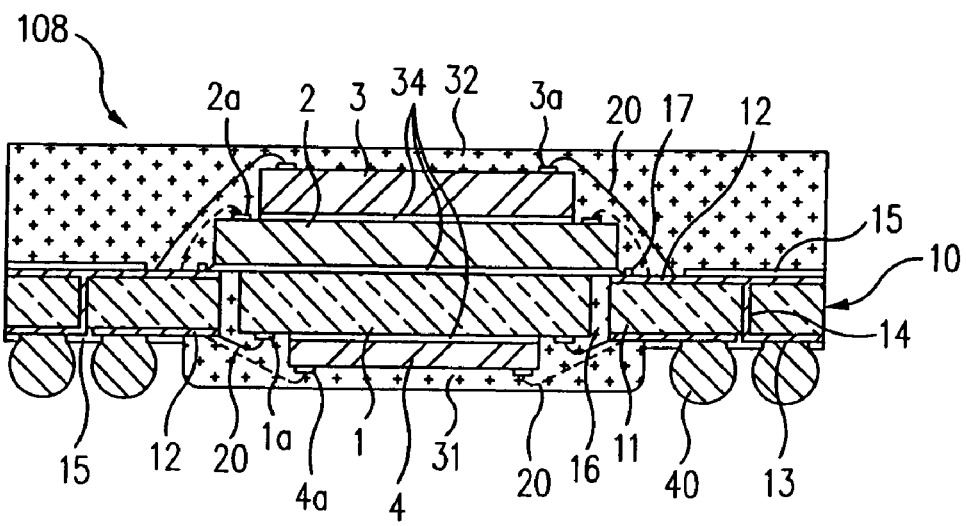

FIGS. 3A to 3C are cross sections showing semiconductor packages 106, 107 and 108 in accordance with a third embodiment of the present invention.

As shown in FIG. 3A, reference numeral 10 designates a circuit board 10 for transmitting signals between a semiconductor chip and a motherboard. The circuit board 10 includes a resin layer 11 having an opening 16 at its center portion. Circuit patterns are formed on the upper and lower surfaces of the resin layer 11. In detail, the upper circuit pattern having bond fingers 12 is formed on the upper surface of the resin layer 11, while the lower circuit pattern having bond fingers and ball lands is formed on the lower surface of the resin layer 11. The circuit patterns formed on the upper and lower surfaces of the resin layer 11 are connected to each other through conductive via holes 14. The resin layer 11 is coated with cover coats 15 of a predetermined thickness at its upper and lower surfaces, with the bond fingers 12 and the ball lands 13 being exposed to the outside through the respective cover coats 15, so that the circuit patterns can be protected from the external environment.

A first semiconductor chip 1 is disposed in the opening 16 of the circuit board 10. A plurality of input/output pads 1a are formed on the lower active surface of chip 1.

A second semiconductor chip 2 is bonded on the upper surface of the first semiconductor chip 1 by means of a bonding agent 34. A plurality of input/output pads 2a are formed on the upper surface of the second semiconductor chip 2.

A dam 17 of a predetermined height is formed on the upper surface of the circuit board 10 to prevent the bonding agent 34, which is used to bond the second semiconductor chip 2 on the first semiconductor chip 1, from contaminating the bond fingers 12. The dam 17 is preferably made of the same material as that of a general cover coat. Alternatively, the bonding agent 34 may be a preformed adhesive film.

Even though a third semiconductor chip 3 that is smaller than the second semiconductor chip 2 may be bonded on the upper surface of the second semiconductor chip 2, the present invention is not limited to this. Of course, a plurality of input/output pads 3a are formed on the upper surface of the third semiconductor chip 3.

The input/output pads 1a, 2a and 3a of the first, second and third semiconductor chips 1, 2 and 3 are respectively connected to the bond fingers 12 formed on the upper and lower surfaces of the circuit board 10 by means of connection means 20, such as an aluminum or gold wire. That is, the input/output pads 1a of the first semiconductor chip 1 are connected to the bond fingers 12 formed on the lower surface of the circuit board 10, while the input/output pads 2a and 3a of the second and third semiconductor chips 2 and 3, respectively, are connected to the bond fingers 12 formed on the upper surface of the circuit board 10.

The predetermined areas of the upper and lower surfaces of the circuit board 10 covering the first, second and third semiconductor chips 1, 2 and 3 and the opening 16 are encapsulated with an insulative encapsulant material. In more detail, the predetermined area of the lower surface of the circuit board 10 covering the first semiconductor chip 1 and the opening 16 is encapsulated with a first encapsulation 31, preferably, a liquid phase encapsulation. However, the first encapsulation 31 is not limited to the liquid phase encapsulation. Additionally, the predetermined area of the upper surface of the circuit board 10 covering the second and third semiconductor chips 2 and 3 and the opening 16 is encapsulated with a second encapsulation 32, preferably, an epoxy molding compound encapsulation. However, the second encapsulation 32 is not limited to the epoxy molding compound encapsulation.

In FIG. 3A, only a central portion of the upper surface of circuit board 10 is encapsulated. The encapsulant 32 is individually molded or otherwise formed. Peripheral portions of the upper surface of circuit board 10 are not covered by encapsulant 32.

As illustrated in FIG. 3B, the entire upper surface of the circuit board 10 may be encapsulated with the second encapsulation 32. The peripheral sides of the encapsulant 32 and circuit board 10 are orthogonal, as would be produced by a saw cut.

A plurality of conductive balls 40, such as solder balls, are respectively fusion-welded on the ball lands 13 of the circuit board 10, that is, the ball lands 13 formed on the lower surface of the circuit board 10, so that the package can be mounted on a motherboard with the conductive balls 40 fusion-bonded on the predetermined pattern of a motherboard.

As illustrated in FIG. 3C, the fourth semiconductor chip 4 may be bonded on the lower surface of the first semiconductor chip 1, but this embodiment is not limited to this. A plurality of input/output pads 4a are formed on the lower surface of the fourth semiconductor chip 4, and the input/output pads 4a are respectively connected to the bond fingers 12 formed on the lower surface of the circuit board 10 by connection means 20. Chips 1–4 may be thinned by polishing or etching the backside (inactive side) of the wafer of dies before dicing.

FIGS. 4A to 4F are cross sections showing a method for fabricating a semiconductor package in accordance with the present invention.

First of all, there is provided a circuit board 10. The circuit board 10 includes a resin layer 11 having an opening 16 at its center portion. Two circuit patterns respectively including bond fingers 12 and the ball lands 13 are respectively formed on the upper and lower surfaces of the resin layer 11. The circuit patterns are connected to each other through conductive via holes 14, which are filled or plated with metal, conductive ink, or some other conductive material.

At this time, a film 18 is bonded on the upper surface of the opening 16 to close the opening 16, so that semiconductor chips 1, 2 and 3 are disposed and bonded easily. Film 18 in may be an adhesive, heat resisting material. For example, film 18 may be a one or two sided adhesive tape or film. Depending on the type of bonding agent subsequently used to affix semiconductor chip 2 to semiconductor chip 1, a ring dam 17 of a predetermined height may be provided on the upper surface of the circuit board in the vicinity of the opening 16 to prevent the bond fingers from being contaminated by a viscous bonding agent.

Figure 4A:
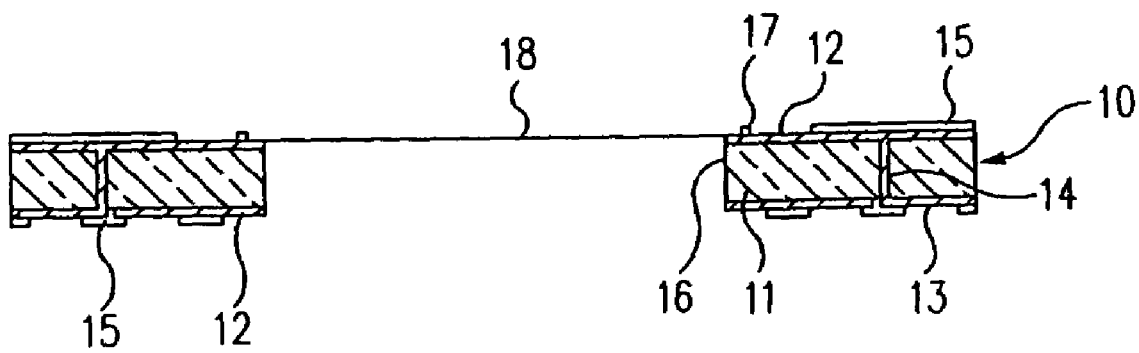
FIGS. 4A to 4F are cross sections showing a method for fabricating a semiconductor package in accordance with the present invention.
Figure 4B:
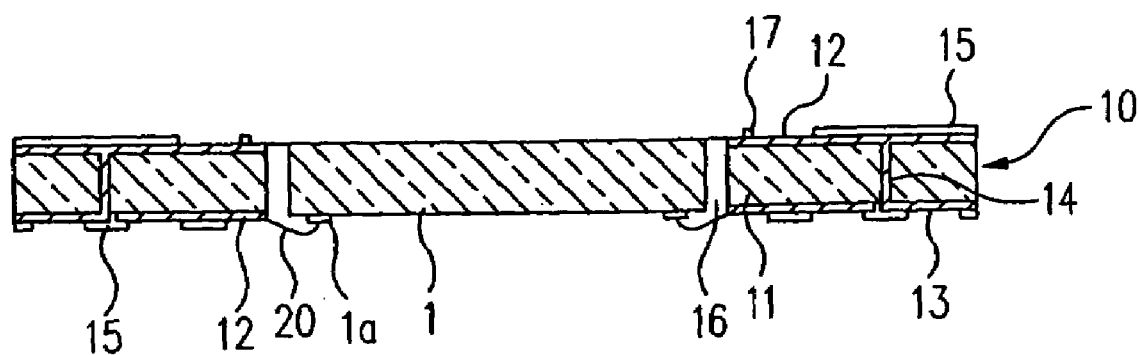

Thereafter, as shown in FIG. 4B, a first semiconductor chip 1 is disposed in the opening 16 of the circuit board 10 on film 18 forming a bond thereto, and is electrically connected to the bond fingers 12 formed on the lower surface of the circuit board 10 by connection means 20.

In this case, first semiconductor chip 1 is a single chip. Alternatively, a previously-formed stack of chips may be disposed in opening 16 in order to make the embodiment of FIG. 3C. Of course, the embodiment of FIG. 3C also may be made by disposing a single chip 1 in opening 16 and then stacking a chip 4 thereon with an adhesive layer 34 therebetween.

Figure 4C:
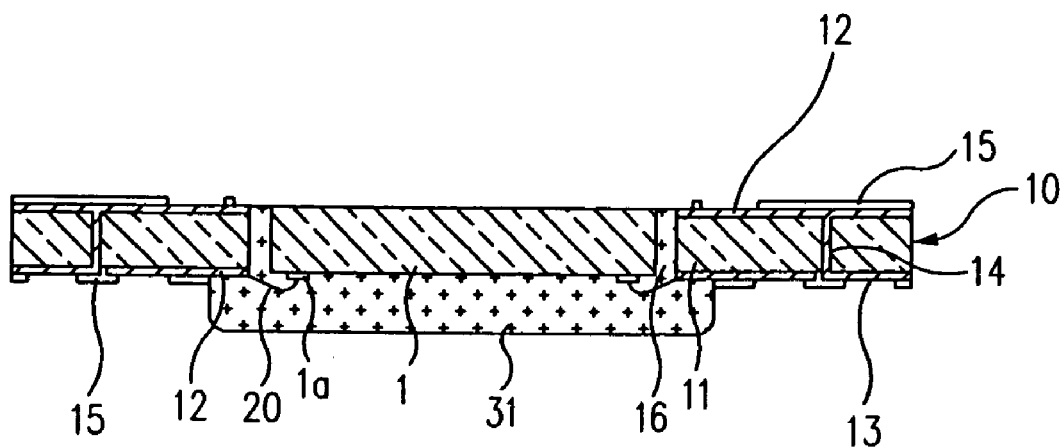

Subsequently, as depicted in FIG. 4C, a predetermined area covering the first semiconductor chip 1 and the opening 16 are encapsulated with a first encapsulation 31. In this case, the first encapsulation 31 is preferably formed of liquid phase encapsulation, but this embodiment is not limited to this. Film 18 acts as a stop to keep encapsulant 31 within opening 16. After curing encapsulant 31, film 18 is removed, which exposes the backside, upper surface of chip 1 and a portion of encapsulant 31 in a common plane with the upper surface of circuit board 10. Alternatively, film 18 may not be removed so as to be present in the completed package.

Figure 4D:
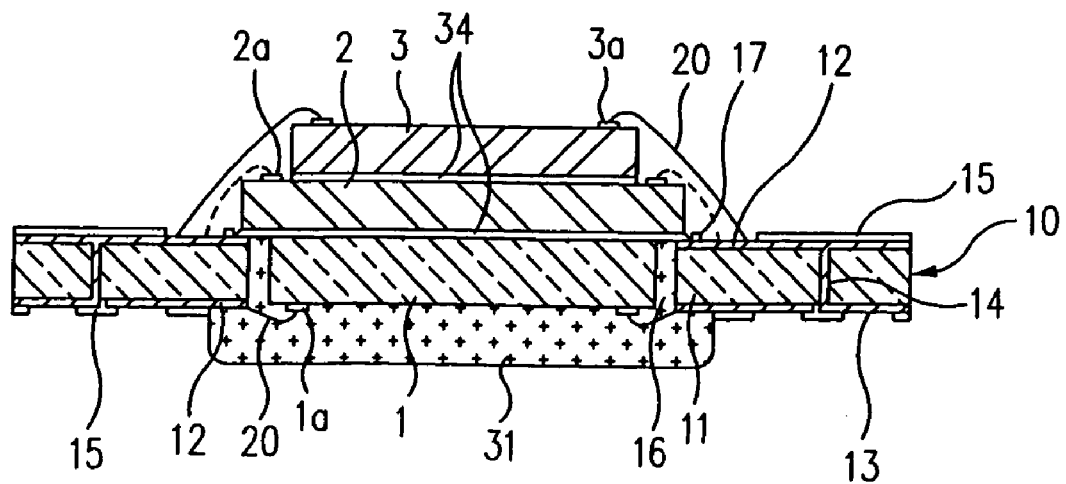

Thereafter, as shown in FIG. 4D, a second semiconductor chip 2, on the upper surface of which a plurality of input/output pads 2a are formed, is bonded on the exposed upper surface of the first semiconductor chip 1 and encapsulant 31 by means of a bonding agent, denoted as adhesive layer 34. Adhesive layer 34 may be a double sided tape or film or may be a viscous epoxy adhesive applied on film 18 within dam 17. Adhesive layer 34 may be applied on film 18 if film 18 has not been removed. Alternatively, if film 18 remains and itself is double sided adhesive, then an additional bonding agent may not be necessary to bond second chip 2 to first chip 1.

In this case, a third semiconductor chip 3 is bonded on the upper surface of the second semiconductor chip 2 with an non-conductive adhesive layer 34. After chip 2 has been attached to chip 1. Alternatively, chips 2 and 3 may be stacked and then the backside of chip 2 maybe attached to chip 1.

Figure 4E:
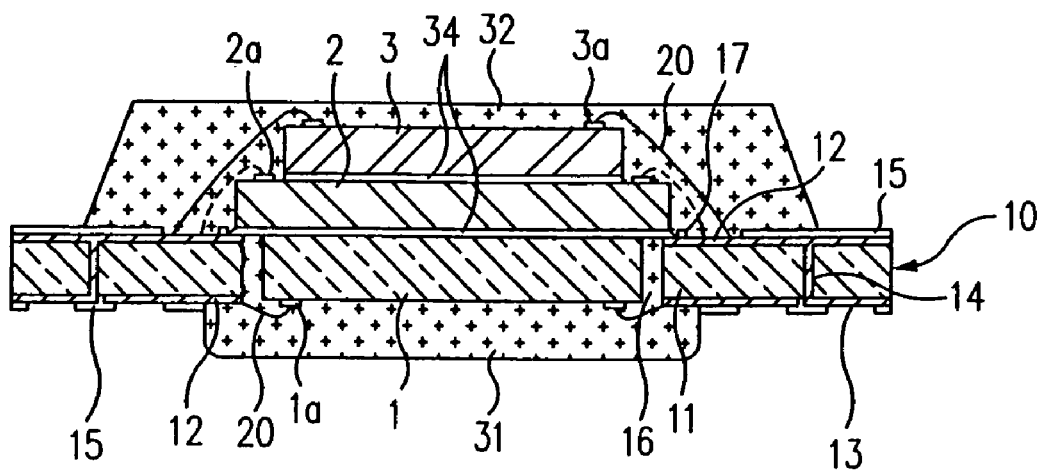

Next, as shown in FIG. 4E, the input/output pads 2a, 3a of the second semiconductor chip 2 and the third semiconductor chip 3, respectively, are connected to the bond fingers 12 formed on the upper surface of the circuit board 10 by connection means 20, e.g., bond wires.

Thereafter, the second and third semiconductor chips 2 and 3 positioned over the opening 16 are encapsulated with a second encapsulation 32. In this case, the second encapsulation 32 may be formed by molding an epoxy molding compound, but this embodiment is not limited to this.

Figure 4F:
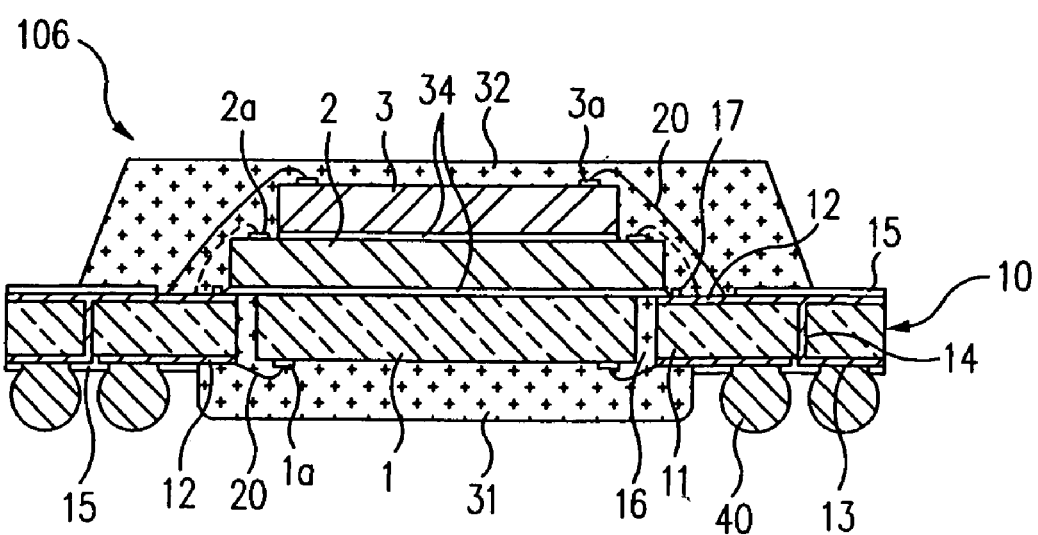

Finally, as shown in FIG. 4F, a plurality of conductive balls 40, such as solder balls, are respectively fusion-welded on the ball lands 13 of the circuit board 10, so that the package is capable of being mounted on a motherboard.

In one embodiment, circuit board 10 is part of strip of identical interconnected units of circuit boards 10 that are arranged in an array (e.g., in a line or in a matrix having rows and columns of circuit boards 10). A package is assembled at each of the units in parallel process steps, and then after completion, the strip is severed with a saw or the like along the perimeter of each unit so as to singulate individual packages each having a circuit board 10. The saw forms orthogonal peripheral sides on circuit board 10. In the embodiment of FIG. 3B, sawing through a block of encapsulant 32 that spans a plurality of the circuit boards 10 of the array produces orthogonal peripheral sides on circuit board 10 and encapsulant 32. Such parallel processing may also be used to assemble the other embodiments of packages described herein (e.g., the method of FIGS. 5A to 5F) provided below.

FIGS. 5A to 5F are cross sections showing another method for fabricating a semiconductor package 106 in accordance with the present invention.

Figure 5A:
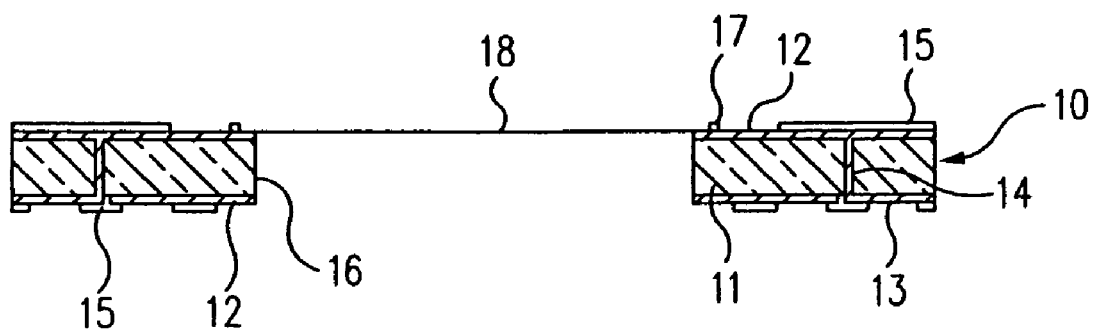
FIGS. 5A to 5F are cross sections showing another method for fabricating a semiconductor package in accordance with the present invention.

As shown in FIG. 5A, there is provided a circuit board 10. The circuit board 10 includes a resin layer 11 having an opening 16 at its center portion. Two circuit patterns including bond fingers 12 and the ball lands 13 and being exposed to the outside are respectively formed on the upper and lower surfaces of the resin layer 11. The upper and lower circuit patterns are connected to each other through conductive via holes 14.

Figure 5B:
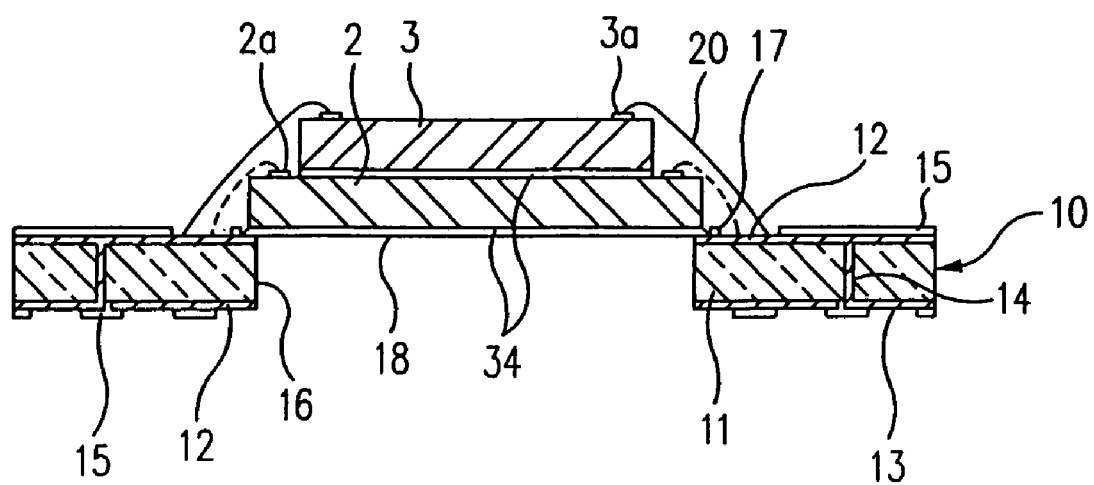

Subsequently, as depicted in FIG. 5B, a film 18 is applied over opening 32. An adhesive layer 34 is applied to film 18 and the portions of the upper surface of circuit board 10 within dam 17. Alternatively, film 18 may be an adhesive tape or film. Second and third semiconductor chips 2 and 3 are bonded to film 18 and the upper surface of the circuit board 10 over opening 16. In this embodiment, the peripheral edges of the lower surface of semiconductor chip 2 are bonded to the upper surface of circuit board 10 around opening 16, but it is not necessary that there be such overlap. The input/output pads 2a and 3a of the second and third semiconductor chips 2 and 3, respectively, are then respectively connected to the bond fingers 12 of the circuit board 10 by means of connection means 20. The area of semiconductor chip 1 is larger than the area of opening 16 such that peripheral edges of chip 2 superimpose and are supported by the upper surface of resin layer 11.

Figure 5C:
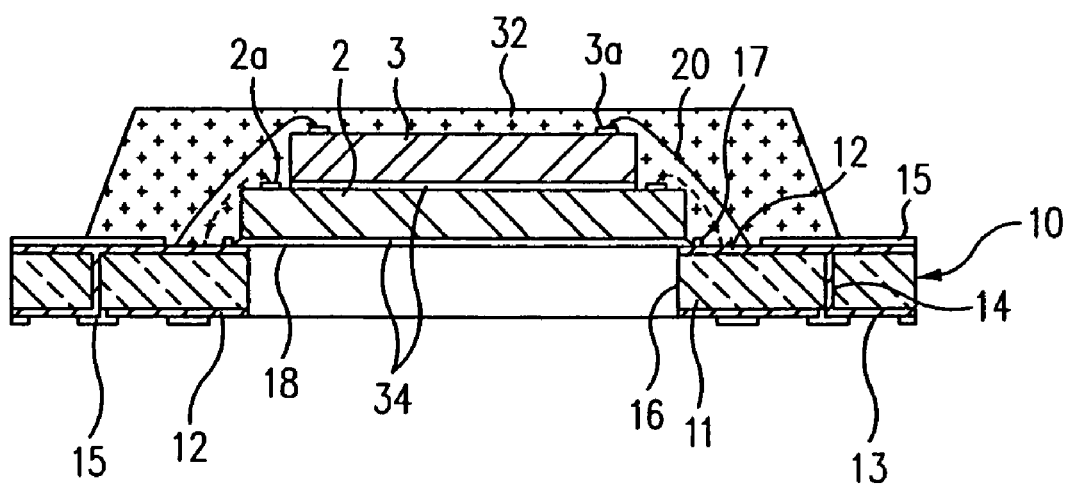

Thereafter, as shown in FIG. 5C, the predetermined area of the upper surface covering the circuit board 10 and the second and third semiconductor chips 2 and 3 are encapsulated with an encapsulation material to form a second encapsulation 32.

Figure 5D:
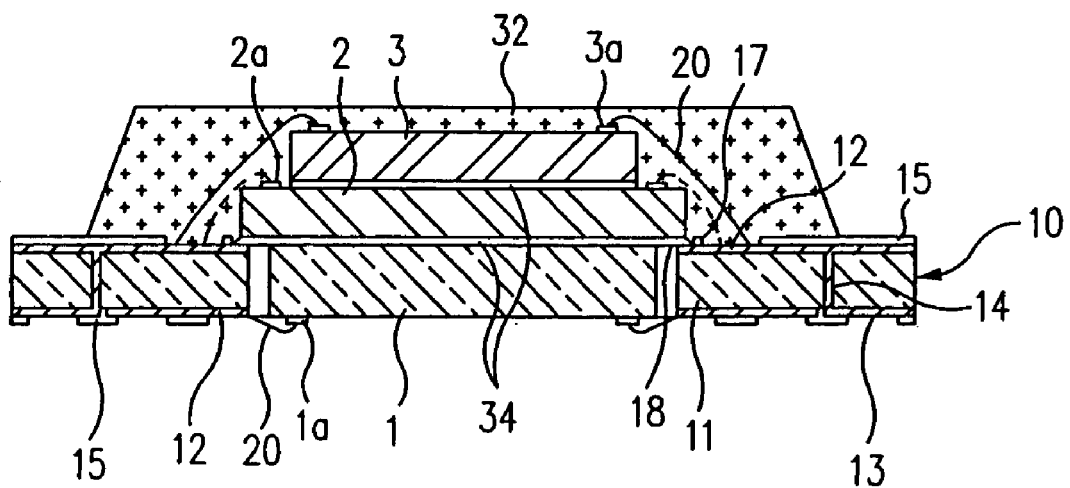

Subsequently, as illustrated in FIG. 5D, a first semiconductor chip 1 having a plurality of input/output pads 1a at its lower surface is disposed in the opening 16 of the circuit board 10 under the second and third semiconductor chips 2 and 3. First semiconductor chip 1 is bonded to the inactive backside of semiconductor chip 2 through film 18. Again, film 18 may be a double sided adhesive, or additional adhesive may be applied to the exposed surface of film 18 within opening 16 prior to the mating of chip 1 thereto. The input/output pads 1a of the first semiconductor chip 1 are connected to the bond fingers 12 of the circuit board 10 by means of connection means 20.

Figure 5E:
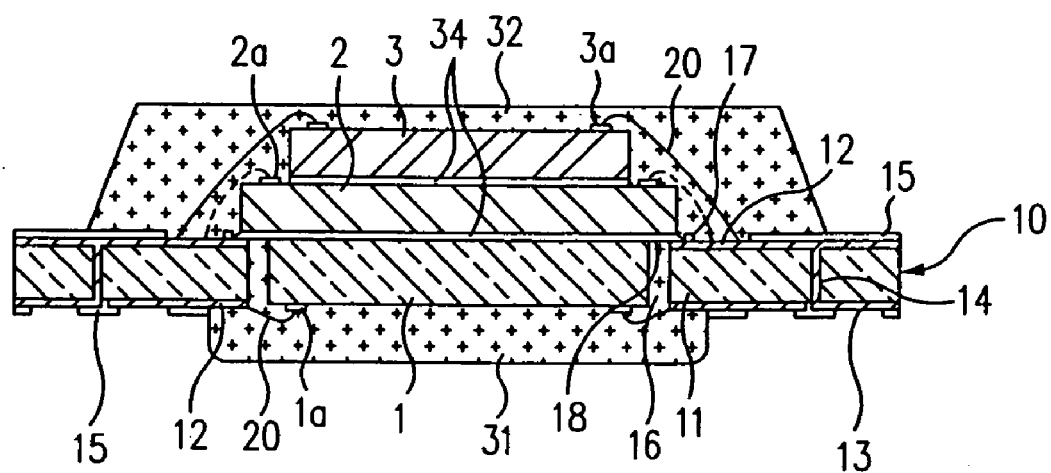
Figure 5F:
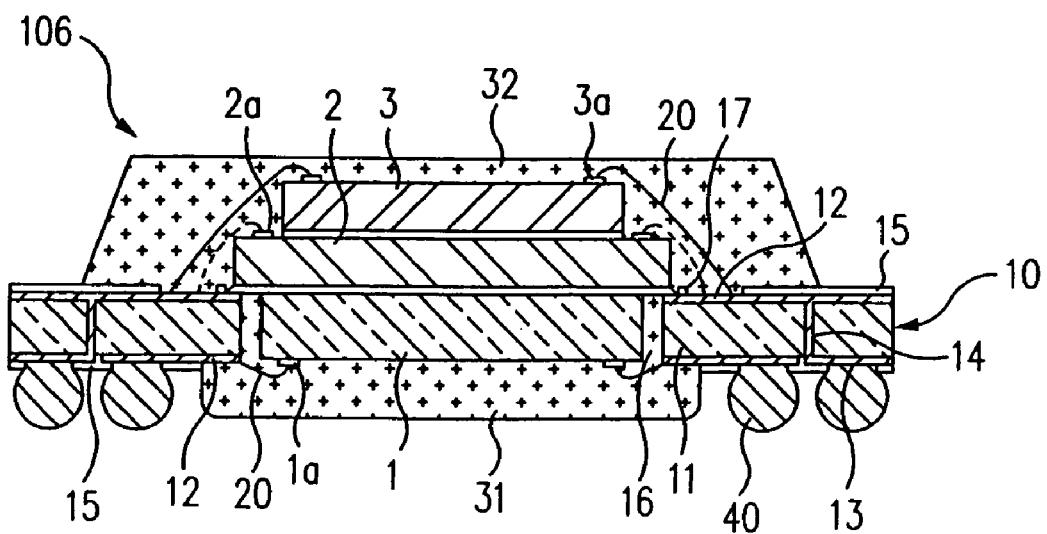

Thereafter, as shown in FIG. 5E, first semiconductor chip 1 and a portion of the lower surface of circuit board 10 are covered with an encapsulation material to form a first encapsulation 31. Encapsulant 31 also fills opening 16.

Finally, a plurality of conductive balls 40 are respectively fusion-welded on the ball lands 13 of the circuit board 10, so that the package is capable of being mounted on a motherboard.

In the semiconductor packages 106, 107 and 108 and method for fabricating the same in accordance with the present invention, a plurality of semiconductor chips are mounted in the opening of the circuit board while being stacked, so that the high density, high function and high capacity of the semiconductor packages are achieved.

Furthermore, in the case of a memory semiconductor chip, the capacity of the semiconductor package can be maximized with the minimum size of the semiconductor package.

Additionally, since an ASIC (application specific integrated circuit) semiconductor chip and a memory semiconductor chip may be packaged together in such a single semiconductor package, many electronic functions can be satisfied by the single semiconductor package.

The embodiments of FIGS. 1A, 1B, 2A, 2B, and 2C may be made by similar methods. For example, a circuit board 10 provided with an opening 16 (or plural openings 16 as in FIG. 2C) may have a temporary film applied over the opening. Subsequently, chips 1 and 2 may be serially mounted on the film, or may be mounted as a stack thereon. After encapsulation with encapsulant 30, the temporary film may be removed, thereby exposing the backside of chip 1 (FIGS. 1A, 1B) or chip 2 (FIGS. 2A–2C). Subsequently, a thermally conductive layer 60 may be applied over the exposed surface of chip 1 (FIG. 1B).

Figure 6:
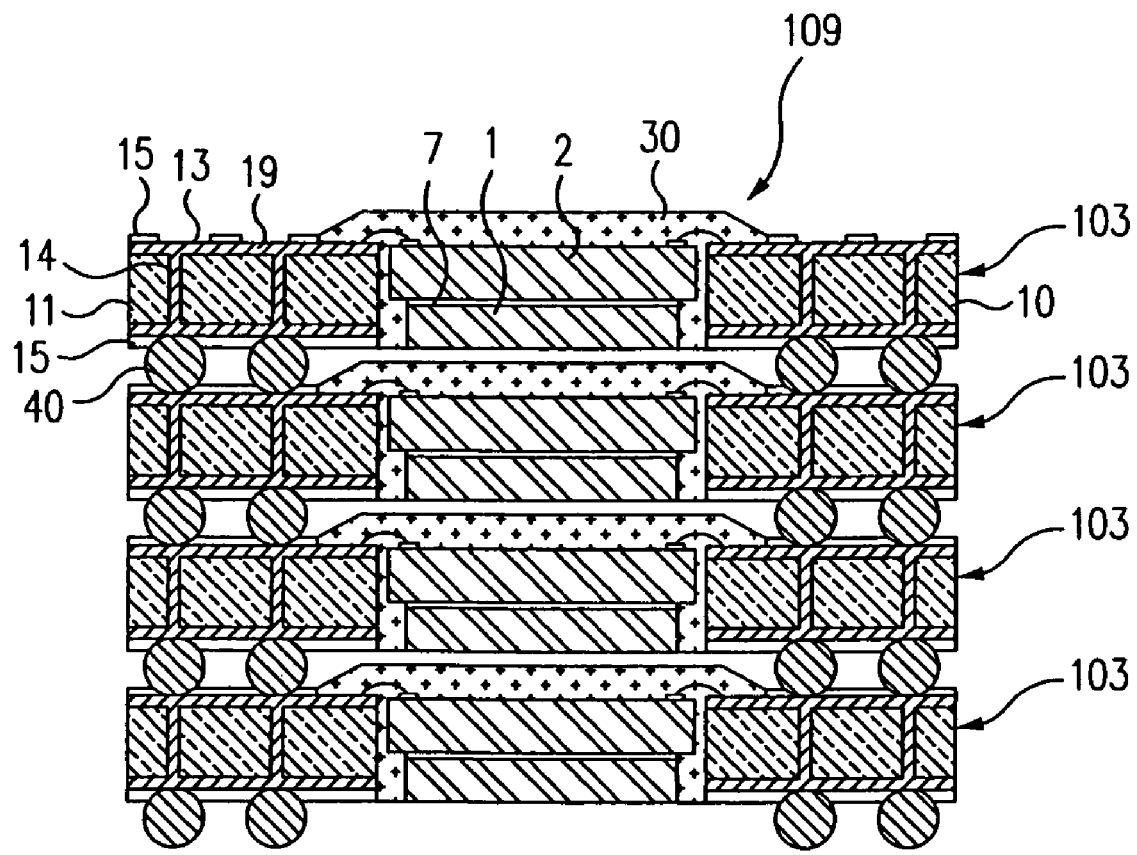
FIG. 6 is a cross section showing a stack type semiconductor package 109 in accordance with a fourth embodiment of the present invention.
Figure 7:
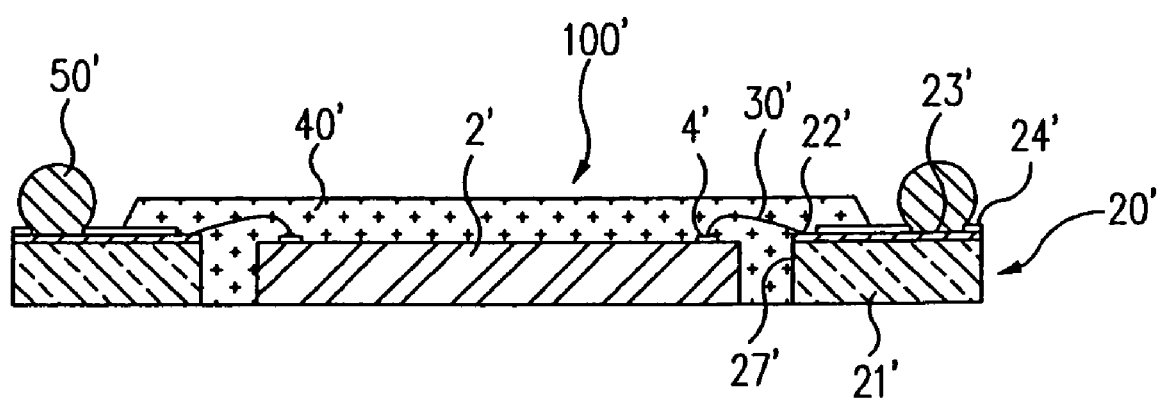
FIG. 7 is a cross section showing a conventional semiconductor package.
Figure 8A:
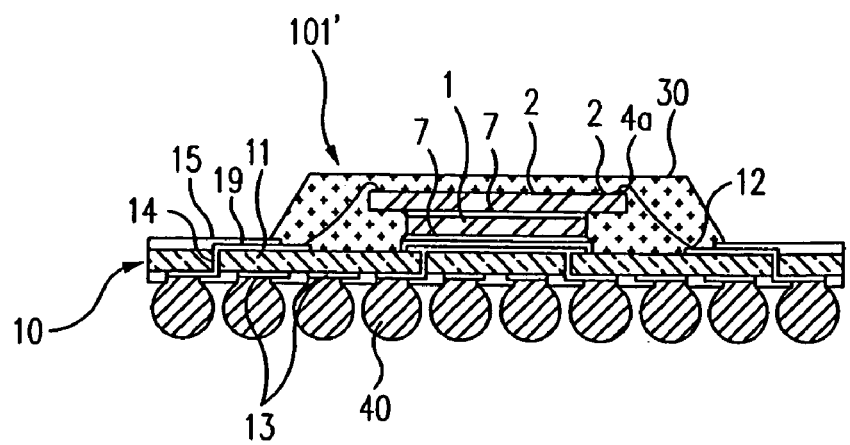
FIG. 8A is a cross section showing a conventional stack type semiconductor package.
Figure 8B:
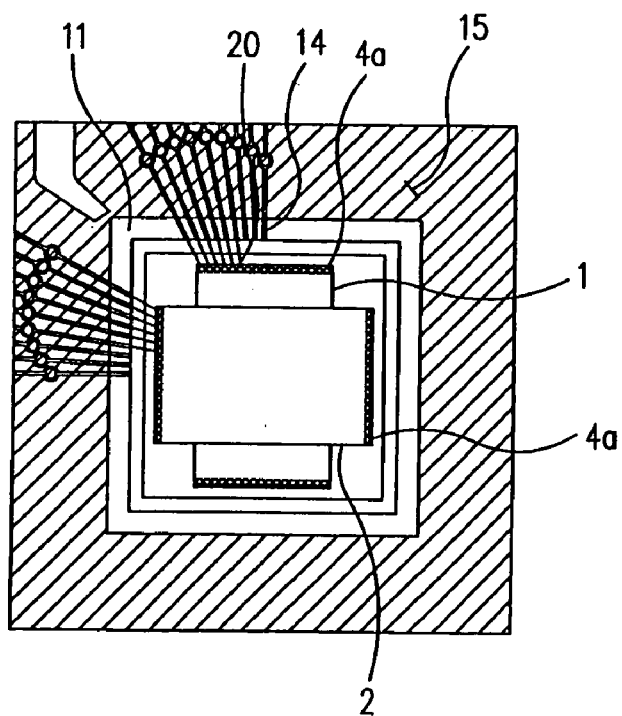
FIG. 8B is a plan view showing the conventional stack type semiconductor package with its encapsulation being removed.

FIG. 6 is a cross section showing a stack type semiconductor package 109 in accordance with a fourth embodiment of the present invention.

Figure 9:
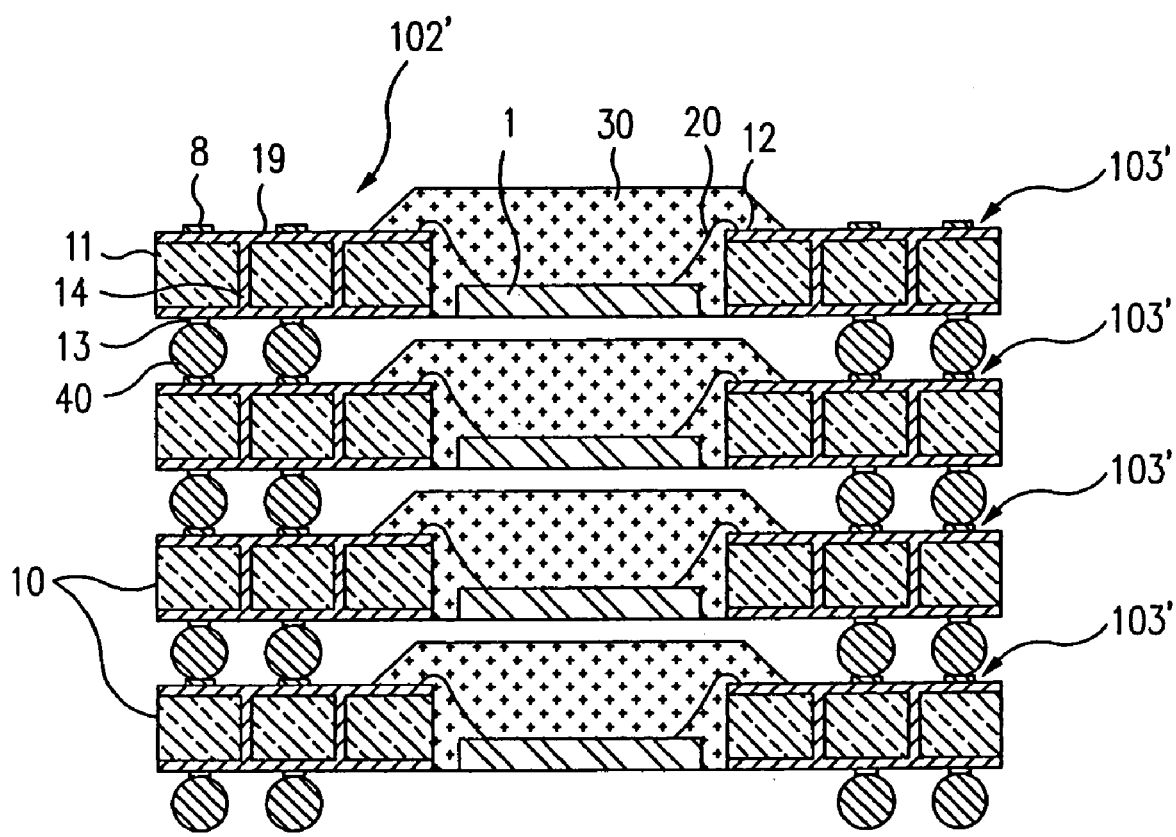
FIG. 9 is a cross section showing a conventional composite stack type semiconductor package.

The semiconductor package 109 of FIG. 6 is similar to the semiconductor package 102' of FIG. 9, except that at least one of semiconductor chip 1 or 2 is disposed in the opening 16 of the circuit board 10, cover coats 15 are applied on the conductive circuit patterns 19 formed on the upper and lower surfaces of the circuit board 10 to insulate and protect the circuit patterns 19, and a plurality of ball lands 13 are respectively formed on the circuit patterns 19 formed on the upper and lower surfaces of the circuit board 10. Accordingly, the description of the similar parts is omitted here.

As shown in FIG. 6, four semiconductor packages are integrated into a combined semiconductor package with one laid on the top of another, in such a way that a plurality of conductive balls 40 are fusion-bonded on the lower surface of the circuit board 10 of each semiconductor package 103 and, thereafter, a plurality of conductive balls 40 formed on the lower surface of the circuit board 10 of one semiconductor package 103 are fusion-bonded on the ball lands 13 formed on the upper surface of the circuit board 10 of another semiconductor package 103.

In the composite stack type semiconductor package in accordance with the fourth embodiment, since a plurality of semiconductor packages are integrated into a single body in such a simple way that the conductive balls 40 of one semiconductor package 103 are fusion-bonded on the ball lands 13 of another semiconductor package 103, the semiconductor packages are easily integrated together without a change in construction. Additionally, since the conductive balls 40 of one semiconductor package 103 are fusion-bonded on the ball lands 13 of another semiconductor package 103, the thickness of the composite stack type semiconductor package 109 is saved by the elimination of the thickness of the projected pads 8 when compared with a conventional stack type semiconductor 102' (refer to FIG. 9).

In accordance with the fourth embodiment, at least one semiconductor chip is disposed within the opening of the circuit board. The embodiment of FIG. 6 has two semiconductor chips are disposed within the opening of the circuit board, which increases density. The chips may be thinned by backside polishing or etching. If the thickness of the circuit board is sufficient, stacked three or more very thin semiconductor chips may be disposed in the opening. Furthermore, a plurality of semiconductor packages having two or more stacked semiconductor chips themselves may be stacked together, as illustrated in FIG. 6.

As described above, in the semiconductor package 108 in accordance with the fourth embodiment, a composite stack type semiconductor can be fabricated easily by forming solder ball lands on the upper and lower surfaces of the circuit board, so that the semiconductor package can be thinned and the mounting density and memory capacity of the semiconductor package can be maximized. Additionally, two or more semiconductor chips are disposed in a single semiconductor package, so that the mounting density of semiconductor chips and the memory capacity of a semiconductor package.

Although various embodiments of the present invention have been disclosed for illustrative purposes, those skilled in the art will appreciate that various modifications, additions and substitutions are possible, without departing from the scope and spirit of the invention as disclosed in the accompanying claims.

The invention claimed:

1. A semiconductor package comprising:
   a substrate having opposing first and second surfaces and an opening extending through the substrate between the first and second surfaces;
   a first conductive circuit pattern disposed on the first surface of the substrate, and a second conductive circuit pattern disposed on the second surface of the substrate, wherein the first conductive circuit pattern includes at least bond fingers and lands, the second conductive circuit pattern includes at least lands, and at least some of the first and second circuit patterns are electrically coupled through the substrate;
   a first semiconductor chip having opposed active and inactive surfaces, wherein the first semiconductor chip is disposed within the opening without contacting the substrate, and the active surface of the first semiconductor chip includes bond pads;
   a second semiconductor chip having opposed active and inactive surfaces, wherein the second semiconductor chip is disposed within the opening without contacting the substrate, and the active surface of the second semiconductor chip includes bond pads,
      wherein the inactive surface of the second semiconductor chip faces and is mounted on the active surface of the first semiconductor chip so that the active surfaces of the first and second semiconductor chips are oriented in a same direction;
   a plurality of first conductive wires, wherein each of the first conductive wires electrically connects a respective one of the bond pads of the first semiconductor chip to a respective one of the bond fingers of the first conductive circuit pattern;
   a plurality of second conductive wires, wherein each of the second conductive wires electrically connects a respective one of the bond pads of the second semiconductor chip to a respective one of the bond fingers of the first conductive circuit pattern, at least some of the second conductive wires being electrically connected to bond fingers located adjacent a first side of the opening, and at least some of the second conductive wires being electrically connected to bond fingers located adjacent a second side of the opening, the first and second sides of the opening being opposite one another; and
   an encapsulant filling the opening and contacting the first surface of the substrate, the bond fingers of the first conductive circuit pattern, the first semiconductor chip, the second semiconductor chip, and the first and second conductive wires,
      wherein the inactive surface of the first semiconductor chip is exposed through the encapsulant in a common plane with the second surface of the substrate, and the lands of the first and second conductive circuit patterns are uncovered by the encapsulant.

2. The semiconductor package of claim 1, wherein the inactive surface of the second semiconductor chip has a smaller area than the active surface of the first semiconductor chip.

3. The semiconductor package of claim 1, wherein the first and second semiconductor chips are a same size.

4. The semiconductor package of claim 1, further comprising a plurality of conductive balls, wherein each of the conductive balls is fused to a respective one of the lands of the second conductive circuit pattern, and the active surfaces of the first and second semiconductor dies are oriented in a same direction as the first surface of the substrate.

5. The semiconductor package of claim 4, wherein the inactive surface of the second semiconductor chip has a smaller area than the active surface of the first semiconductor chip.

6. The semiconductor package of claim 4, wherein the first and second semiconductor chips are a same size.

7. The semiconductor package of claim 1, further comprising a plurality of conductive balls, wherein each of the conductive balls is fused to a respective one of the lands of the first conductive circuit pattern, and the active surfaces of the first and second semiconductor dies are oriented in a same direction as the first surface of the substrate.

8. The semiconductor package of claim 7, wherein the inactive surface of the second semiconductor chip has a smaller area than the active surface of the first semiconductor chip.

9. The semiconductor package of claim 7, wherein the first and second semiconductor chips are a same size.

10. The semiconductor package of claim 1 wherein vias electrically couple the at least some of the first and second circuit patterns through the substrate.

11. The semiconductor package of claim 1 wherein the substrate comprises a resin layer.

12. The semiconductor package of claim 1 wherein the first semiconductor chip and the second semiconductor chip are selected from the group consisting of a memory chip, a logic chip and a processor chip.

13. The semiconductor package of claim 1 wherein the opening is a first opening, the substrate further comprising a second opening extending through the substrate between the first and second surfaces of the substrate.

14. The semiconductor package of claim 13 further comprising at least one semiconductor chip disposed within the second opening without contacting the substrate.

15. A semiconductor package comprising:
   a first semiconductor package stacked on a second semiconductor package, wherein each of the first and second semiconductor packages comprises:
   a substrate having opposing first and second surfaces and an opening extending through the substrate between the first and second surfaces;
   a first conductive circuit pattern disposed on the first surface of the substrate, and a second conductive circuit pattern disposed on the second surface of the substrate, wherein the first conductive circuit pattern includes at least bond fingers and lands, the second conductive circuit pattern includes at least lands, and at least some of the first and second circuit patterns are electrically coupled through the substrate;
   a first semiconductor chip having opposed active and inactive surfaces, wherein the first semiconductor chip is disposed within the opening without contacting the substrate, and the active surface of the first semiconductor chip includes bond pads;

a second semiconductor chip having opposed active and inactive surfaces, wherein the second semiconductor chip is disposed within the opening without contacting the substrate, and the active surface of the second semiconductor chip includes bond pads,
    wherein the inactive surface of the second semiconductor chip faces and is mounted on the active surface of the first semiconductor chip so that the active surfaces of the first and second semiconductor chips are oriented in a same direction;
a plurality of first conductive wires, wherein each of the first conductive wires electrically connects a respective one of the bond pads of the first semiconductor chip to a respective one of the bond fingers of the first conductive circuit pattern;
a plurality of second conductive wires, wherein each of the second conductive wires electrically connects a respective one of the bond pads of the second semiconductor chip to a respective one of the bond fingers of the first conductive circuit pattern, at least some of the second conductive wires being electrically connected to bond fingers located adjacent a first side of the opening, and at least some of the second conductive wires being electrically connected to bond fingers located adjacent a second side of the opening, the first and second sides of the opening being opposite one another; and
an encapsulant filling the opening and contacting the first surface of the substrate, the bond fingers of the first conductive circuit pattern, the first semiconductor chip, the second semiconductor chip, and the first and second conductive wires,
wherein the inactive surface of the first semiconductor chip is exposed through the encapsulant in a common plane with the second surface of the substrate, and the lands of the first and second conductive circuit patterns are uncovered by the encapsulant.

16. The semiconductor package of claim 15, further comprising a plurality of conductive balls, wherein each of the conductive balls is fused to a respective one of the lands of the first conductive circuit pattern of the second semiconductor package and a respective one of the lands of the second conductive circuit pattern of the first semiconductor package.

17. The semiconductor package of claim 16 wherein the first semiconductor package is mounted on the second semiconductor package by the conductive balls.

18. The semiconductor package of claim 15 further comprising at least a third semiconductor package stacked on the first semiconductor package.

19. A semiconductor package comprising:
    a substrate having opposing first and second surfaces and an opening extending through the substrate between the first and second surfaces;
    a first conductive circuit pattern disposed on the first surface of the substrate, the first conductive circuit pattern includes at least bond fingers;
    a first semiconductor chip having opposed active and inactive surfaces, wherein the first semiconductor chip is disposed within the opening without contacting the substrate, and the active surface of the first semiconductor chip includes bond pads;
    a second semiconductor chip having opposed active and inactive surfaces, wherein the second semiconductor chip is disposed within the opening without contacting the substrate, and the active surface of the second semiconductor chip includes bond pads;
    a plurality of first electrical connection means, wherein each of the first electrical connection means is for electrically connecting a respective one of the bond pads of the first semiconductor chip to a respective one of the bond fingers of the first conductive circuit pattern; and
    a means for protecting filling the opening and contacting the first surface of the substrate, the bond fingers of the first conductive circuit pattern, the first semiconductor chip, and the first electrical connection means,
    wherein the inactive surface of the first semiconductor chip is exposed through the means for protecting in a common plane with the second surface of the substrate.

20. The semiconductor package of claim 19 further comprising:
    a second conductive circuit pattern disposed on the second surface of the substrate, at least some of the first and second circuit patterns are electrically coupled through the substrate; and
    a plurality of second electrical connection means, wherein each of the second electrical connection means is for electrically connecting a respective one of the bond pads of the second semiconductor chip to a respective one of bond fingers of the first circuit pattern.

* * * * *